(12) United States Patent
Hasegawa et al.

(10) Patent No.: US 12,279,378 B2
(45) Date of Patent: Apr. 15, 2025

(54) WIRING BOARD AND DISPLAY DEVICE

(71) Applicant: KYOCERA Corporation, Kyoto (JP)

(72) Inventors: Nobuyuki Hasegawa, Sanda (JP); Fumiaki Haraguchi, Yasu (JP)

(73) Assignee: KYOCERA Corporation, Kyoto (JP)

( * ) Notice: Subject to any disclaimer, the term of this patent is extended or adjusted under 35 U.S.C. 154(b) by 153 days.

(21) Appl. No.: 18/036,628

(22) PCT Filed: Nov. 2, 2021

(86) PCT No.: PCT/JP2021/040361
§ 371 (c)(1),
(2) Date: May 11, 2023

(87) PCT Pub. No.: WO2022/107590
PCT Pub. Date: May 27, 2022

(65) Prior Publication Data
US 2024/0023248 A1  Jan. 18, 2024

(30) Foreign Application Priority Data

Nov. 18, 2020  (JP) .................................. 2020-192044

(51) Int. Cl.
*H05K 3/10* (2006.01)
*H05K 1/02* (2006.01)
(Continued)

(52) U.S. Cl.
CPC ............. *H05K 3/103* (2013.01); *H05K 1/028* (2013.01); *H05K 1/0306* (2013.01); *H05K 1/183* (2013.01); *H05K 3/381* (2013.01); *H05K 2201/0272* (2013.01); *H05K 2201/10106* (2013.01); *H05K 2201/10128* (2013.01)

(58) Field of Classification Search
CPC . H05K 3/103; H05K 2201/0272; H05K 1/092
See application file for complete search history.

(56) References Cited

U.S. PATENT DOCUMENTS 6,025,901 A * 2/2000 Adachi ............... G02F 1/13452
349/158
2018/0190631 A1* 7/2018 Kim ..................... H01L 25/162
(Continued)

FOREIGN PATENT DOCUMENTS

| JP | H4-125477 U | 11/1992 |
|---|---|---|
| JP | H7-50355 A | 2/1995 |

(Continued)

*Primary Examiner* — Sherman Ng
(74) *Attorney, Agent, or Firm* — Procopio, Cory, Hargreaves & Savitch LLP

(57) ABSTRACT

A wiring board includes a substrate including a first main surface, a second main surface, a side surface, and an inclined surface connecting the first main surface and the side surface, and side wiring on the first main surface, the inclined surface, and the side surface. The side wiring has a content of conductive particles greater than a content of an insulating component, and the wiring has a thickness equal to a thickness of at least one of the conductive particles in a first corner between the first main surface and the inclined surface and in a second corner between the inclined surface and the side surface.

18 Claims, 9 Drawing Sheets

(51) Int. Cl.
*H05K 1/03* (2006.01)
*H05K 1/09* (2006.01)
*H05K 1/18* (2006.01)
*H05K 3/38* (2006.01)

(56) References Cited

U.S. PATENT DOCUMENTS

2018/0190747 A1\* 7/2018 Son ................. H10K 59/128
2020/0203235 A1\* 6/2020 Jung ................ H01L 22/32
2020/0259056 A1\* 8/2020 Hong ............... H01L 27/1262

FOREIGN PATENT DOCUMENTS

| JP | 2000-182879 | A | 6/2000 |
| JP | 2003-158353 | A | 5/2003 |
| JP | 2003-243804 | A | 8/2003 |
| JP | 2005-19576 | A | 1/2005 |
| JP | 2010-161127 | A | 7/2010 |
| JP | 2019-150992 | A | 9/2019 |
| JP | 2020-13735 | A | 1/2020 |

\* cited by examiner

WIRING BOARD AND DISPLAY DEVICE

TECHNICAL FIELD

The present disclosure relates to a wiring board that can be used, for example, as a board on which circuit wiring is formed, a board on which, for example, electronic devices or light emitters are mounted, or a board for a micro-light-emitting diode (LED) display including, for example, microchip LEDs (hereafter also referred to as μLEDs) as light emitters, and to a display device including the wiring board.

BACKGROUND OF INVENTION

Techniques are described in Patent Literatures 1 to 3 for improving the conduction stability of wiring in, for example, semiconductor packages, chip-resistors, and ceramic electronic components. These techniques reduce a decrease in the film thickness of wiring extending from a main surface through corners to side surfaces of a substrate by chamfering the corners in which the main surface intersects with the side surfaces.

CITATION LIST

Patent Literature

Patent Literature 1: Japanese Unexamined Patent Application Publication No. 7-050355
Patent Literature 2: Japanese Unexamined Patent Application Publication No. 2019-150992
Patent Literature 3: Japanese Unexamined Patent Application Publication No. 2000-182879

SUMMARY

In an aspect of the present disclosure, a wiring board includes a substrate including a main surface, a side surface, and an inclined surface connecting the main surface and the side surface, and wiring on the main surface, the inclined surface, and the side surface. The wiring has a content of conductive particles greater than a content of an insulating component, and the wiring has a thickness equal to a thickness of at least one of the conductive particles in a first corner between the main surface and the inclined surface and in a second corner between the inclined surface and the side surface.

In another aspect of the present disclosure, a display device includes the above wiring board, and a plurality of light emitters in a matrix on a first main surface of the substrate.

Advantageous Effect

The wiring board and the display device in the above aspects of the present disclosure include the wiring having the content of the conductive particles greater than (e.g., not less than 80 wt %) the content of the insulating component, thus causing the conductive particles to at least easily contact or fuse with one another. Numerous conductive particles are connected to one another with contact portions, fusion portions, or both portions to form a conductive path network, thus providing high conductivity. The insulating component enters numerous gaps in the conductive path network to serve as a binding member (binder), with which the conductive path network is less likely to break. A conductive paste for forming wiring has the content of conductive particles greater than the content of an uncured insulating component and thus has higher apparent viscosity and less fluidity. Such a conductive paste applied to each corner of a substrate is less likely to flow downward along the inclined surface and the side surface of the substrate and is less likely to be discontinuous in the corner. The wiring contains the insulating component of, for example, a curable resin filling fine irregularities on the surfaces of the substrate and improves the bonding force of the wiring, thus easily allowing the wiring to bond firmly to the surfaces of the substrate. The wiring has a thickness equal to the thickness of at least one conductive particle in the first corner and in the second corner. This reduces the width and the thickness of the wiring. The wiring is thus highly connective with high-density wiring located on the main surface of the substrate. The resultant wiring board and the display device include the wiring that is highly connective with high-density wiring and has highly stable conduction. The wiring board and the display device also reduce the amount of the conductive paste to be applied.

BRIEF DESCRIPTION OF THE DRAWINGS

The objects, features, and advantages of the present invention will become more apparent from the following detailed description and the drawings.

DESCRIPTION OF EMBODIMENTS

The structure that forms the basis of a light emitter board and a display device including the light emitter board according to one or more embodiments of the present disclosure will be described.

Patent Literature 1 above describes a lid board for a semiconductor package including a ceramic substrate, Patent Literature 2 above describes a board for a chip resistor including an alumina substrate, and Patent Literature 3 above describes a known board for an electronic component including a ceramic substrate. Such substrates made of ceramics (ceramic substrates) are not highly flat and thus are not suitable for wiring boards with high-density wiring, such as glass boards for tiling panels for display devices including micro light-emitting diodes (μLEDs) that display high-definition images on a large screen. However, side wiring can relatively easily be formed on a ceramic substrate for conduction of the front and back surfaces through the side surfaces of the substrate. More specifically, a ceramic substrate has rough surfaces including its side surfaces. Side wiring can be formed by applying a conductive paste to such side surfaces and firing the paste to bond relatively firmly to the ceramic substrate surface without easily detaching.

A glass substrate has a highly flat surface that allows high-density wiring with a small wiring width and with a small thickness to be formed easily with a thin film deposition technique, such as chemical vapor deposition (CVD). However, side wiring to be formed on such a glass substrate using a conductive paste cannot firmly bond to the glass substrate surface and may detach. Further, side wiring with a smaller wire width for thinner wiring formed on a glass substrate for connection to high-density wiring on the main surface of the substrate can bond with a less bonding force to the glass substrate and thus can more easily detach. Known wiring boards include glass substrates as insulating substrates with high-density wiring that are increasingly formed densely for images with higher definition. Such wiring boards are also to include side wiring that is highly connective with high-density wiring and having highly stable conduction.

A wiring board according to one or more embodiments of the present disclosure will now be described with reference to the accompanying drawings.

Figure 1:
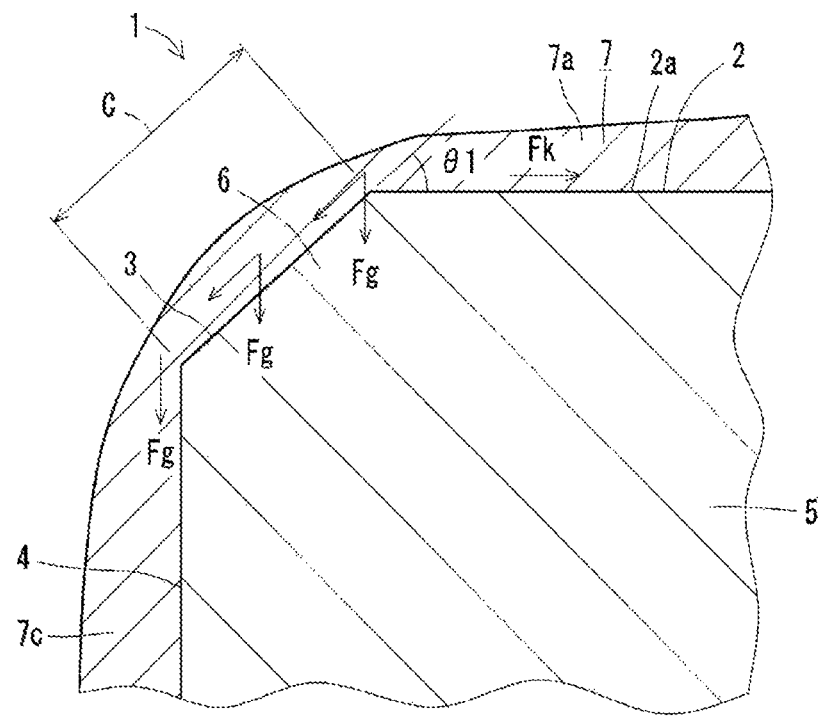
FIG. 1 is a partially enlarged cross-sectional view of an example wiring board according to an embodiment of the present disclosure, illustrating a corner of a substrate with wiring.
Figure 2:
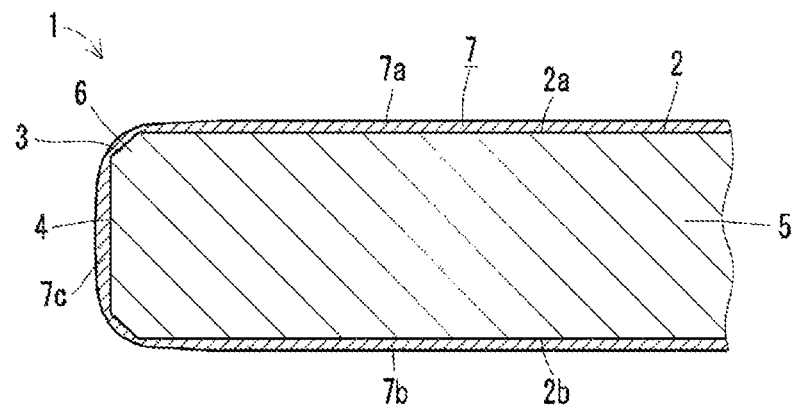
FIG. 2 is a partial cross-sectional view of an end of the wiring board illustrated in FIG. 1.

FIG. 1 is a partially enlarged cross-sectional view of an example wiring board 1 according to an embodiment of the present disclosure, illustrating a corner of a substrate with wiring. FIG. 2 is a partial cross-sectional view of an end of the wiring board 1 illustrated in FIG. 1. The wiring board 1 according to the present embodiment includes a substrate 5 including a main surface 2, side surfaces 4 perpendicular to the main surface 2, inclined surfaces 3 connecting the main surface 2 and the side surfaces 4, and wiring (hereafter referred to as side wiring) 7 on corners 6 at each of which the main surface 2, one inclined surface 3, and one side surface 4 meet. The side wiring 7 extends over the main surface 2, the inclined surfaces 3, and the side surfaces 4.

As illustrated in FIGS. 4 to 9, the side wiring 7 has the content of conductive particles 7p greater than the content of an insulating component 7i and has a thickness equal to the thickness of at least one conductive particle 7p in a first corner 6a between the main surface 2 and the corresponding inclined surface 3 and in a second corner 6b between the corresponding inclined surface 3 and the corresponding side surface 4.

In the present embodiment, the wiring board 1 with the above structure produces the effects described below. The wiring 7 has the content of the conductive particles 7p greater than (e.g., not less than 80 wt %) the content of the insulating component 7i, thus causing the conductive particles 7p to at least easily contact or fuse with one another. Numerous conductive particles 7p are connected to one another with contact portions, fusion portions, or both portions to form a conductive path network, thus providing high conductivity. The insulating component 7i enters numerous gaps in the conductive path network to serve as a binding member (binder), with which the conductive path network is less likely to break. A conductive paste 7s (illustrated in FIG. 8) for forming the wiring 7 has the content of the conductive particles 7p greater than the content of an uncured insulating component lip (illustrated in FIG. 8) and thus has higher apparent viscosity and less fluidity. The conductive paste 7s applied to each corner of the substrate 5 is less likely to flow downward along the inclined surface 3 and the side surface 4 of the substrate 5 and is less likely to be discontinuous in the corner. The side wiring 7 contains the insulating component 7i of, for example, a curable resin filling fine irregularities on the surfaces of the substrate 5 and improves the bonding force of the wiring 7, thus easily allowing the wiring 7 to bond firmly to the surfaces of the substrate 5. The wiring 7 has a thickness equal to the thickness of at least one conductive particle 7p in the first corner 6a and in the second corner 6b. This reduces the width and the thickness of the wiring 7. The wiring is thus highly connective with high-density wiring located on the main surface 2 of the substrate 5. The resultant wiring board 1 includes the wiring that is highly connective with the high-density wiring and has highly stable conduction. The wiring board 1 also reduces the amount of the conductive paste to be applied.

The wiring board 1 according to the present embodiment may include a glass substrate as the substrate 5. The glass substrate has a highly flat surface that facilitates formation of high-density wiring suitable for, for example, a display device. A glass substrate may also allow, for example, an IC or a flexible printed circuit (FPC) to be formed on its back surface and the side wiring 7 to be formed on its side surfaces for electrical connection between the high-density wiring on the front surface and the IC or another component on the back surface. More specifically, a glass substrate is suitable for such a multifunctional wiring board 1.

The substrate 5 may be made of a glass material such as borosilicate glass, crystallized glass, or a material containing quartz. The substrate 5 may be made of blue plate glass (soda glass) mainly containing silicon dioxide ($SiO_2$), sodium oxide ($Na_2O$), and calcium oxide (CaO). Blue plate glass has the lowest melting point of all types of glass, is easy to process, and is inexpensive. The substrate 5 may be made of white plate glass (alkali-free glass) mainly containing $SiO_2$, boric acid ($B_2O_3$), and aluminum oxide ($Al_2O_3$). White plate glass is inexpensive and has a high transmittance in the wavelength ranges of visible light, ultraviolet light, and infrared light. White plate glass typically has an upper temperature limit of 120 to 130° C. in normal use, which is equivalent to that of blue plate glass. The substrate 5 may be made of a quartz glass mainly containing $SiO_2$. The quartz glass is high purity glass with few impurities. The quartz glass has a high transmittance to ultraviolet light and infrared light and a high heat resistant temperature. The quartz glass has an upper temperature limit of about 900° C. in normal use. The quartz glass is highly resistant to chemicals and easily undergoes processing such as boring and cutting.

A range of values referred to herein as one value to another value intends to mean the two values being inclusive.

The substrate 5 may be a sapphire glass (single crystal of $Al_2O_3$) substrate (also referred to as a sapphire crystal substrate). Sapphire glass has a Mohs hardness of as high as 9, a heat resistant temperature of about 2000° C., and a thermal conductivity of 42 W/(mK) (at 20° C.), which is several tens of times the thermal conductivity of the glass being 1.4 W/(mK) (at 20° C.).

The substrate 5 may be a resin substrate or a ceramic substrate. The substrate 5 may be a composite substrate including multiple types of substrates of a glass substrate, a resin substrate, and a ceramic substrate stacked on one another.

Figure 11:
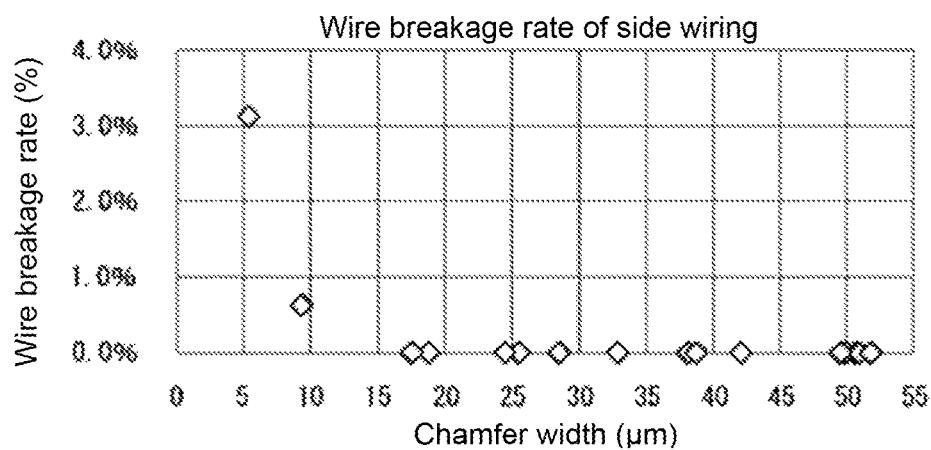
FIG. 11 is a graph showing the relationship between the chamfer width of the inclined surface in the corner of the substrate and the wire breakage rate.

As illustrated in FIG. 1, the substrate 5 includes an inclined surface 3 at a corner 6. The inclined surface 3 may have a width c of 10 to 200 μm inclusive. With the inclined surface 3 with the width c less than 10 μm, the wiring 7 is more likely to break as shown in FIG. 11. The inclined surface 3 with the width c exceeding 200 μm may extend over an area including high-density wiring, an electronic device, and a light emitter on the main surface 2 of the substrate 5. Such an inclined surface 3 on the substrate 5 for a display device such as a micro-LED display may extend over the display area on the display device.

The inclined surface 3 may be a convexly curved surface. In this structure, the main surface 2 and the inclined surface 3 have a small angle between them in the first corner 6a. The wiring 7 is less likely to be discontinuous in the first corner 6a. The inclined surface 3 may be a curved surface, such as a partially spherical, partially ellipsoidal, or partially cylindrical surface. The second corner 6b also produces the same or similar effects. To produce the same or similar effects, the inclined surface 3 may be a convex composite surface including multiple flat surfaces.

The inclined surface 3 may be a concavely curved surface. In this structure, the conductive paste is less likely to flow downward along the inclined surface 3 to the side surface 4. The inclined surface 3 may be a curved surface, such as a partially spherical, partially ellipsoidal, or partially cylindrical surface. To produce the same or similar effects, the inclined surface 3 may be a concave composite surface including multiple flat surfaces.

Figure 10:
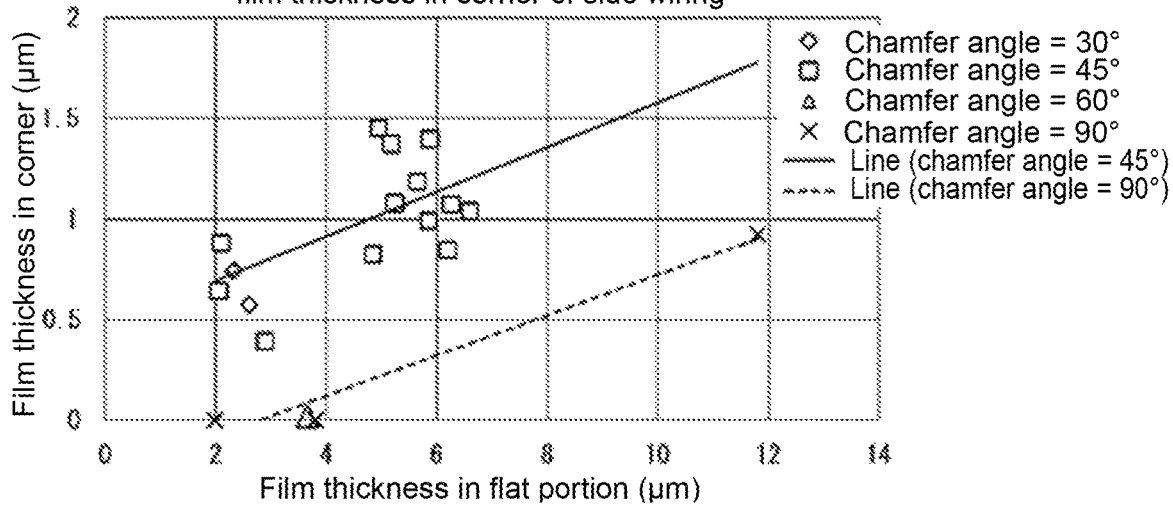
FIG. 10 is a graph showing the relationship between the film thickness of the wiring on a main surface of the substrate and the film thickness of the wiring on an inclined surface in the corner of the substrate.

The wiring 7 may have a thickness t of 2 to 10 μm inclusive. For the thickness t less than 2 μm, as shown in FIG. 10, the thickness tin the first corner 6a and in the second corner 6b of the wiring 7 tends to be less than 0.4 μm (thickness in FIG. 4), which is the thickness of one conductive particle 7p. Thus, the wiring 7 can easily be discontinuous in the first corner 6a and in the second corner 6b. For the thickness t exceeding 10 μm, as shown in FIG. 10, the thickness tin the first corner 6a and in the second corner 6b of the wiring 7 tends to exceed 1.6 μm (thickness in FIG. 7), which is the thickness of two conductive particles 7p. Thus, the side wiring 7 can have a larger thickness on the main surface 2 of the substrate 5, thus degrading the connectivity with the high-density wiring located on the main surface 2. The amount of the conductive paste to be applied may not be reduced easily.

The substrate 5 may be, for example, triangular, quadrangular (square or rectangular), trapezoidal, circular, elliptic, oval, pentagonal, or in any other shape. The main surface 2 of the substrate 5 includes a first main surface 2a and a second main surface 2b opposite to the first main surface 2a. The side surfaces 4 each connect the first main surface 2a and the second main surface 2b between an edge of the first main surface 2a and an edge of the second main surface 2b. The side surface 4 may be or may not be at right angles to the first main surface 2a and the second main surface 2b. The side surface 4 may be at an angle slightly greater than or less than a right angle (by greater than 0° and not greater than) 20° to the first main surface 2a and the second main surface 2b.

The wiring board 1 according to the present embodiment is used as, for example, a substrate for a single large tiling panel (also referred to as a multi-display) including multiple micro-LED display devices each including a matrix of microchip LEDs (hereafter also referred to as μLEDs) arranged planarly and joined (tiled) together on their side surfaces.

Each of the above μLED display devices has, for example, the structure described below. More specifically, a drive system (also referred to as a drive) for the panel, such as an IC and a flexible wiring board, is located on the second main surface 2b, which is the back surface of the substrate 5, and electrode pads connected to the side wiring 7 are located in a frame portion adjacent to the edge of the first main surface 2a and in a frame portion adjacent to the edge of the second main surface 2b. A wiring portion 7c is located on the side surface 4 of the substrate 5 to connect the electrode pad on the first main surface 2a to the electrode pad on the second main surface 2b. The wiring portion 7c electrically connects a wiring portion 7a on the first main surface 2a and a wiring portion 7b on the second main surface 2b. In other words, the side wiring 7 includes the wiring portions 7a, 7b, and 7c. The μLED device includes multiple pixel units including pixel circuits including μLEDs and thin-film transistors (TFT) that drive and control the emission of the μLEDs. The pixel units are arranged in a matrix on the first main surface 2a (display surface) of the μLED display device.

The drive may be a drive element, such as an IC or an LSI circuit, mounted on the second main surface 2b of the substrate 5 by, for example, chip on glass (COG). The drive may also be a thin-film circuit with a TFT including a semiconductor layer made of low-temperature polycrystalline silicon (LTPS) formed by thin film deposition such as CVD on the second main surface 2b of the substrate 5. The drive may be a drive element included in a flexible wiring board connected to an external connection terminal located on the second main surface 2b of the substrate 5. The drive may be an external drive element electrically connected to the wiring on the flexible wiring board.

Multiple μLED displays may be joined together into a composite display device, or a multi-display. In this structure, multiple pixel units are located on the first main surface 2a. The multiple pixel units are arranged in a matrix with a predetermined pixel pitch. The pixel pitch may be, for example, about 50 to 500 μm, about 100 to 400 μm, or about 380 μm. Each pixel unit is electrically connected to the drive system on the second main surface 2b with the electrode pad and the side wiring 7.

As described above, the structure may include multiple μLEDs as light emitters in a matrix on the first main surface of the substrate 5 and the drive electrically connected to the multiple μLEDs with the wiring 7 on the second main surface of the substrate 5. The drive is located on the second main surface 2b of the substrate 5. The drive used for a multi-display is unviewable to a viewer and thus eliminates interference with the image display. With no drive on the frame portion of the μLED display device, the μLED display device can easily reduce or eliminate the frame portion. The multi-display can also reduce or eliminate its frame portion.

Figure 3A:
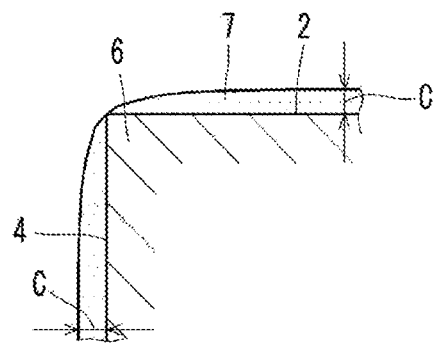
FIG. 3A is a cross-sectional view of a wiring layer with a different shape for the shape of a corner of the substrate.
Figure 3B:
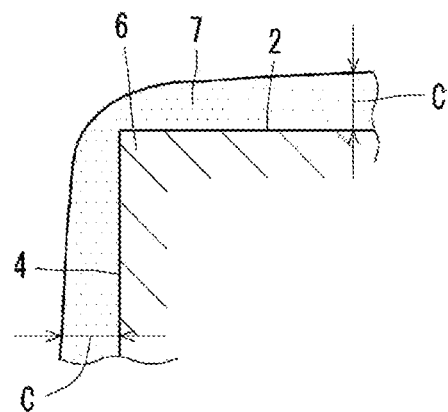
FIG. 3B is a cross-sectional view of a wiring layer with a different shape for the shape of a corner of the substrate.
Figure 3C:
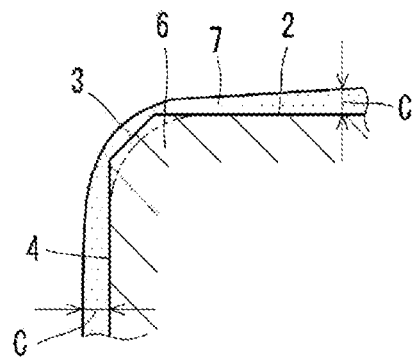
FIG. 3C is a cross-sectional view of a wiring layer with a different shape for the shape of a corner of the substrate.

FIGS. 3A to 3C are cross-sectional views of the wiring 7 each with a different shape for the shape of the corner 6 of the substrate 5. As illustrated in FIG. 3A, the corner 6 of the substrate 5 is at a right angle between the main surface 2 and the side surface 4 and has a sharply pointed corner (edge tip). In this structure, the side wiring 7 has the thickness t of substantially 0 μm on the corner 6 and can break easily. The side wiring 7 has the thickness t less than 10 μm on the main surface 2 and on the side surface 4. Although the side wiring 7 has high connectivity with the high-density wiring located on the main surface 2, the conductivity of the side wiring 7 can decrease easily as described above.

As illustrated in FIG. 3B, a larger amount of the conductive paste 7s may be applied to allow the thickness t of the side wiring 7 to be greater than or equal to 10 μm on the main surface 2 and on the side surface 4. This allows the side wiring 7 to have an intended thickness in the corner 6 as well. This structure can easily have lower connectivity between the high-density wiring located on the main surface 2 and the side wiring 7. The side wiring 7 also increases the manufacturing cost.

As illustrated in FIG. 3C, the wiring board 1 according to the present embodiment includes the substrate 5 with the inclined surface 3 that is formed by chamfering, for example, the corner 6. The inclined surface 3 has a width c of 10 to 200 μm inclusive, as described above. For the width c less than 10 μm, the wiring 7 is more likely to break as described above. For the width c exceeding 200 μm, as described above, the inclined surface 3 may extend over an area including high-density wiring, an electronic device, and a light emitter on the main surface 2 of the substrate 5.

The inclined surface 3 in the wiring board 1 according to the present embodiment may have an inclination angle of 30 to 60° inclusive with respect to the main surface 2 and an inclination angle of 30 to 60° inclusive with respect to the side surface 4. In this structure, the side wiring 7 is less likely to be discontinuous in the first corner 6a and in the second corner 6b of the substrate 5. This also facilitates formation of the side wiring 7 with the thickness t of 2 to 10 μm inclusive.

Figure 8:
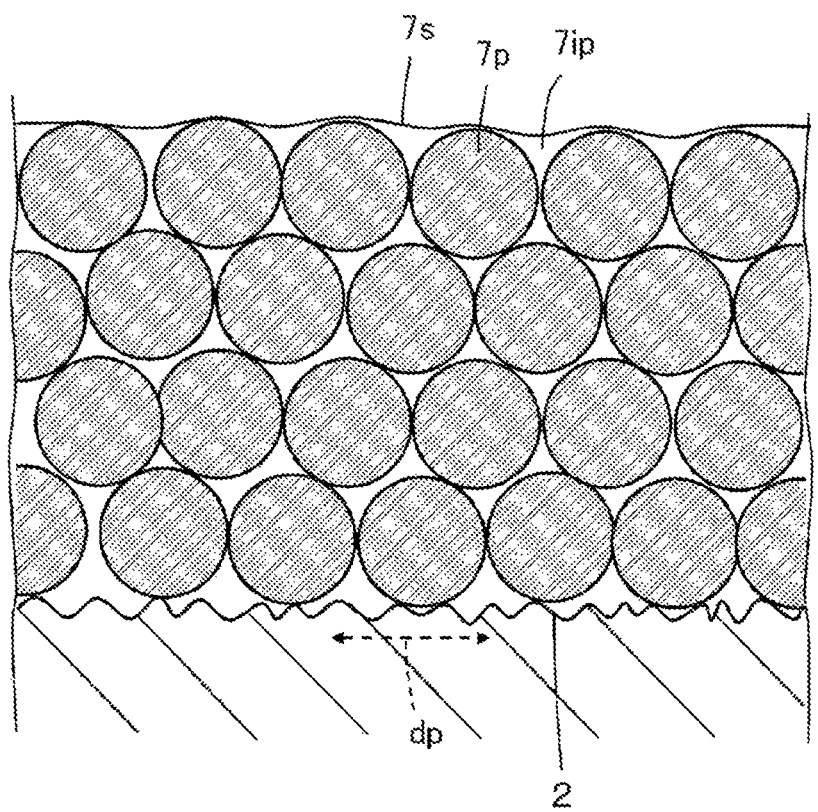
FIG. 8 is a partially enlarged cross-sectional view of a wiring board according to another embodiment of the present disclosure, schematically illustrating a roughened main surface of a substrate on which a conductive paste is applied.

The main surface 2 of the substrate 5 has a first surface roughness Ra1. The inclined surface 3 has a second surface roughness Ra2. The side surface 4 has a third surface roughness Ra3. At least two of the surface roughness values Ra1, Ra2 and Ra3 may differ from each other. In this case, as illustrated in FIG. 8, the conductive paste 7s is applied to, for example, the roughened main surface 2. The insulating component 7ip containing an uncured epoxy resin contained in the conductive paste 7s fills the fine irregularities on the main surface 2, increasing the bonding force with an intermolecular force. The conductive particles 7p contained in the conductive paste 7s are then trapped in the fine irregularities on the main surface 2 to reduce the fluidity of the conductive paste 7s in a plane direction dp of the main surface 2. This increases the bonding force of the conductive paste 7s to the main surface 2.

Figure 9:
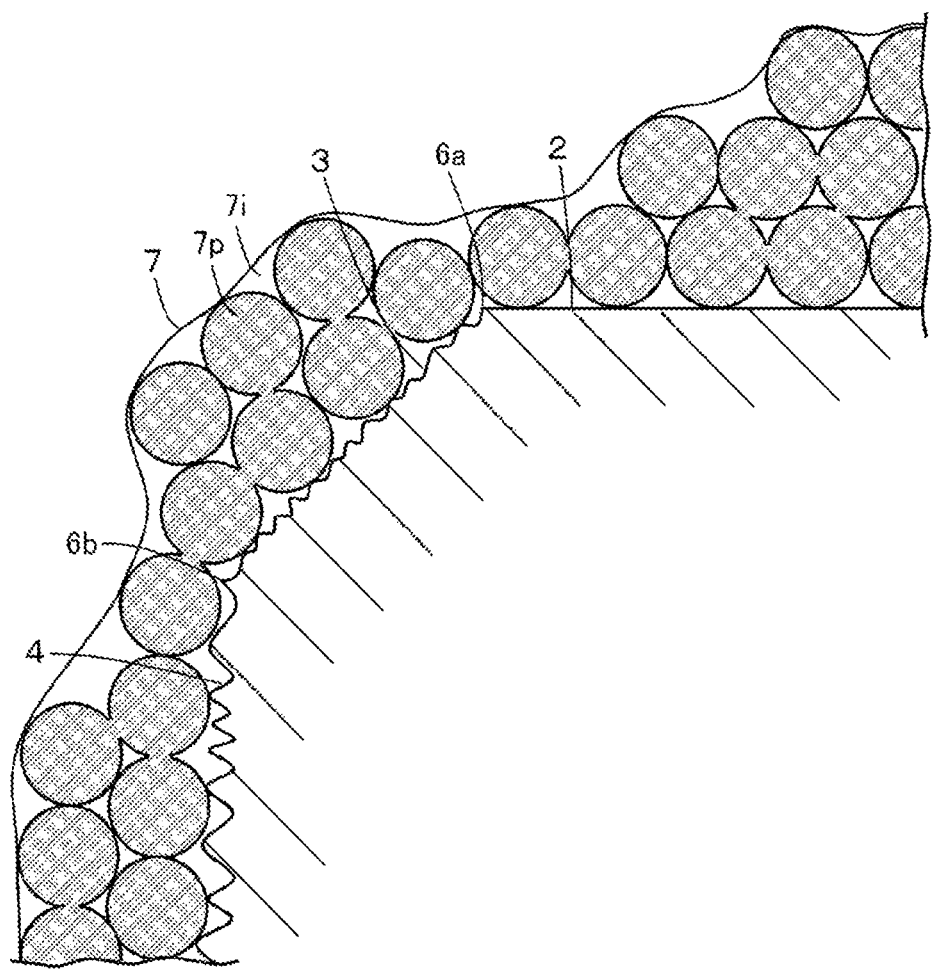
FIG. 9 is a partially enlarged cross-sectional view of a wiring board according to another embodiment of the present disclosure, schematically illustrating a corner of a substrate with wiring.

As illustrated in FIG. 9, the value Ra2 may be greater than the value Ra1. In this structure, although the conductive paste 7s applied to the inclined surface 3 can easily flow downward to the side surface 4 under gravity, increasing the bonding force of the conductive paste 7s on the inclined surface 3 can reduce the likelihood of the conductive paste 7s flowing downward.

As illustrated in FIG. 9, the value Ra3 may be greater than the value Ra2. In this structure, although the conductive paste 7s applied to the side surface 4 tends to flow downward under gravity, increasing the bonding force of the conductive paste 7s on the side surface 4 can reduce the likelihood of the conductive paste 7s flowing downward.

As illustrated in FIG. 9, the value Ra2 may be greater than the value Ra1, and the value Ra3 may be greater than the value Ra2 (Ra3>Ra2>Ra1). In this structure, increasing the bonding force of the conductive paste 7s on the inclined surface 3 and the bonding force of the conductive paste 7s on the side surface 4 can further reduce the likelihood of the conductive paste 7s flowing downward. The value Ra1 may be about 1 to 100 nm, the value Ra2 may be about 50 to 200 nm, and the value Ra3 may be about 100 to 500 nm.

The relationship between these values may also be Ra3=Ra2>Ra1. In this structure as well, increasing the bonding force of the conductive paste 7s on the inclined surface 3 and the bonding force of the conductive paste 7s on the side surface 4 can further reduce the likelihood of the conductive paste 7s flowing downward.

The surface roughness (arithmetic mean roughness) can be adjusted by adjusting the grade (mean grain size) of an abrasive used for grinding a target surface, such as an alumina abrasive and a diamond abrasive. When, for example, a grinder for grinding a target surface with a side surface of its rotating disk-shaped grinding member is used, the grade (mean grain size) of an abrasive attached to the side surface of the grinding member is selected to obtain a desired arithmetic mean roughness for the target surface.

The inclined surface 3 of the wiring board 1 may be a rough surface including a linear or strip-shaped recess with the length in the direction along the edge of the first corner 6a (the edge direction of the second corner 6b) longer than the length in the direction orthogonal to the edge direction. In this structure, the linear or strip-shaped recess can be an elongated step in the direction orthogonal to the direction in which the conductive paste 7s flows downward. This effectively reduces the likelihood of the conductive paste 7s flowing downward along the inclined surface 3. For the inclined surface 3 formed with, for example, the side surface of a disk-shaped grinding member, the linear or strip-shaped recess may be formed by, for example, setting the direction of rotation (tangential direction) of the side surface of the grinding member to be aligned with the edge direction of the first corner 6a. Multiple linear or strip-shaped recesses may be formed across the surface of the inclined surface 3. The linear or strip-shaped recess may have a lateral length of about 1 to 100 μm and a longitudinal length of about 10 to 200 μm. The longitudinal length may be more than one time and not more than about 10 times the lateral length. The lengths are not limited to these ranges. The linear or strip-shaped recess may have a depth of about 30 to 100 nm, but the depth is not limited to this range.

To form the side wiring 7, the conductive paste 7s containing conductive particles 7p such as Ag particles, a resin component containing, for example, an uncured epoxy resin, an alcohol such as ethyl alcohol, and water is printed and applied to the main surface 2, the inclined surface 3, and the side surface 4 of the substrate 5, followed by firing the applied conductive paste 7s to form the side wiring 7. The conductive paste 7s may contain glass frit. With no inclined surface 3 in each corner of the substrate 5, for example, a Ag paste 7s as the conductive paste 7s may not be easily screen-printed on the edge of the main surface 2 and the side surface 4 with a uniform thickness in each corner. The corners may not be easily coated with the Ag paste 7s. Thus, the conductive paste 7s with an insufficient thickness and with lower conductivity can bond to each corner of the substrate 5, or can cause the substrate 5 to have exposed portions in each corner.

The wiring board 1 according to the present embodiment includes the inclined surface 3 formed in each corner 6 between the main surface 2 and the side surface 4 of the substrate 5 by, for example, chamfering the corner 6. The side wiring 7 may be formed by printing, applying, and firing the conductive paste 7s such as a Ag paste on the main surface 2, the side surface 4, and the inclined surface 3. The Ag paste may have, for example, the weight ratio of Ag being 85 wt % (weight %) including solid and volatile components before curing at printing, and the weight ratio of Ag being 95 wt % of a solid after curing.

The particle size (mean particle size) of the conductive particles 7p before firing may be about 0.8 to 3.0 µm, but is not limited to this value. For example, the conductive particles 7p may have the particle size of about 0.1 to 10.0 µm before firing. However, when the particle size of the conductive particles 7p before firing is less than 0.1 µm, numerous conductive particles 7p tend to combine with one another into layers when the conductive particles 7p are fired. When numerous conductive particles 7p combine together into layers, the insulating component 7i containing, for example, a curable resin can also be layers. These layered components tend to separate and cause the wiring 7 to detach. For the conductive particles 7p with the particle size before firing exceeding 10.0 µm, the side wiring 7 can have a greater wiring width, a greater thickness, and lower connectivity with the high-density wiring.

Figure 4:
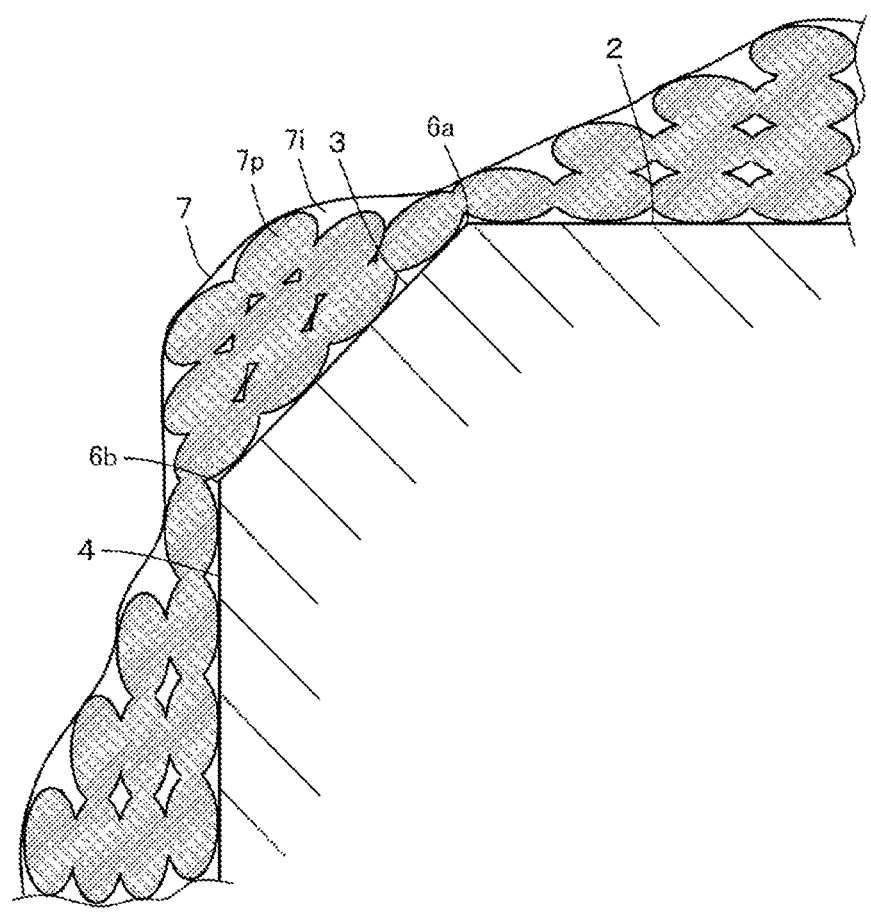
FIG. 4 is a partially enlarged cross-sectional view of a wiring board according to another embodiment of the present disclosure, schematically illustrating a corner of a substrate with wiring.
Figure 5:
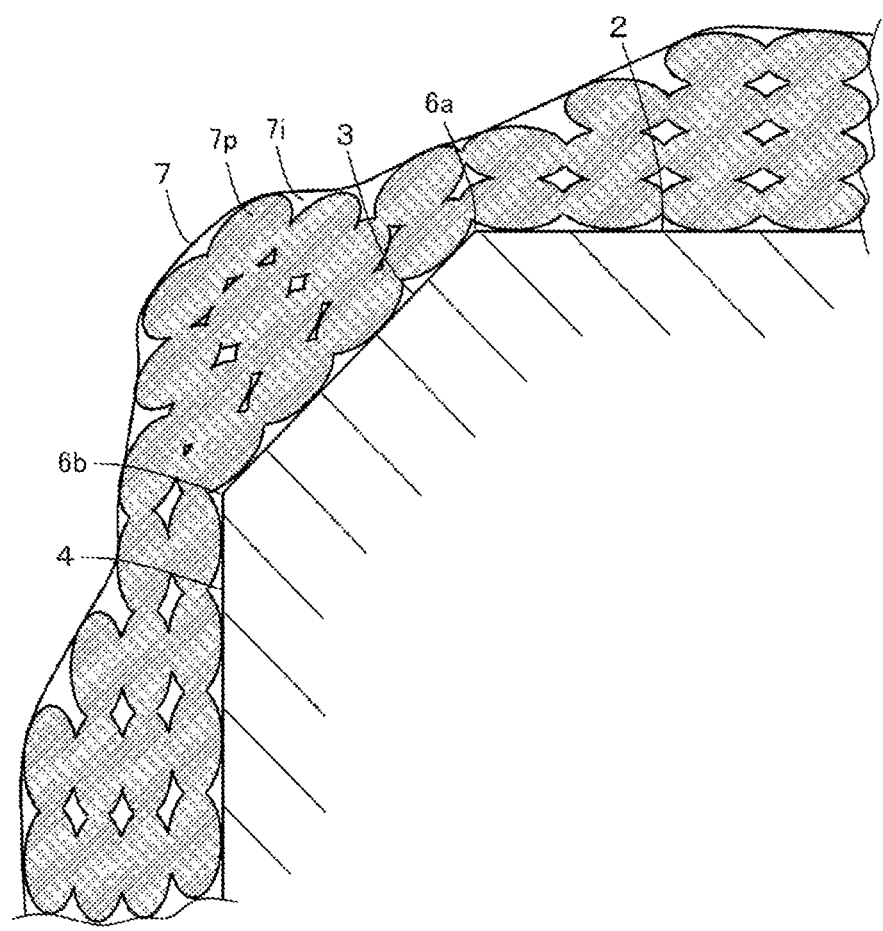
FIG. 5 is a partially enlarged cross-sectional view of a wiring board according to another embodiment of the present disclosure, schematically illustrating a corner of a substrate with wiring.

The conductive particles 7p may include spherical particles and irregularly shaped particles such as flakes. In this case, the irregularly shaped particles have a large surface area, and can have a larger heat absorbing area. The irregularly shaped particles easily melt during firing and thus tend to serve as fusion portions that connect spherical particles. The conductive particles 7p may be dense or hollow, or may be both dense and hollow. The conductive particles 7p being hollow have a low heat capacity and thus easily melt and deform as illustrated in FIGS. 4 and 5. The conductive particles 7p easily melt during firing and thus can also easily serve as fusion portions that connect spherical particles.

The side wiring 7 may have the content of the conductive particles 7p not less than 80 wt %. The conductive paste 7s for forming the side wiring 7 has the content of the conductive particles 7p greater than the content of the uncured insulating component lip and can have higher apparent viscosity and less fluidity effectively. The conductive paste 7s applied to each corner of the substrate 5 is less likely to flow downward along the inclined surface 3 and the side surface 4 of the substrate 5 and is less likely to be discontinuous in the corner. To achieve this more effectively, the content of the conductive particles 7p in the side wiring 7 may be not less than 90 or 95 wt %.

The side wiring 7 may include a conductive paste 7s containing conductive particles of, for example, Ag, Cu, Al, or stainless steel, an uncured resin component such as an epoxy resin, an alcohol solvent, and water. The conductive paste 7s may be printed and applied to an intended portion from the side surface 4 to the first main surface 2a and to the second main surface 2b and cured by heating, photocuring using ultraviolet ray irradiation, or a combination of photocuring and heating. The side wiring 7 may also be formed by thin film deposition such as plating, vapor deposition, or CVD. The side surface may include a preformed groove in the portion to receive the side wiring 7. This allows the conductive paste 7s that forms the side wiring 7 to be easily received in the intended portion on the side surface 4. A coating layer (overcoat layer) of, for example, a resin material may cover and protect the side wiring 7.

As illustrated in FIG. 4, the conductive particles 7p have a major diameter and a minor diameter, and the side wiring 7 may have a thickness at least equal to the minor diameter of the conductive particles 7p in the first corner 6a and in the second corner 6b. When the side wiring 7 is formed by applying and firing the conductive paste 7s, the conductive particles 7p tend to deform and may be flat or oval with a major diameter and a minor diameter through melting deformation or fusion, or by the weight of the conductive particles 7p during firing. The conductive particles 7p that are hollow may also easily deform into a shape with a major diameter and a minor diameter. The conductive particles 7p tend to have the major diameter direction substantially parallel to the plane direction of the surface of the substrate 5 after firing. The wiring 7 can thus have a thickness at least equal to the minor diameter of the conductive particles 7p in the first corner 6a and in the second corner 6b of the substrate 5. This structure reduces the thickness of the side wiring 7. This further improves the connectivity of the side wiring 7 with the high-density wiring on the main surface 2 of the substrate 5. The amount of the conductive paste 7s to be applied can be reduced.

The conductive particles 7p may have a minor diameter (a) that is about r/2 when the conductive particles 7p are spherical with a diameter r before firing. For example, when the diameter r is 0.8 µm, the minor diameter r1 may be about 0.4 µm. The diameter r1 may be $0.1 \leq r1 \leq 0.9r$ or $0.3r \leq r1 \leq 0.7r$. The minor diameter r1 varies depending on the melting point of the conductive particles 7p, whether the conductive particles 7p are hollow, the firing temperature, the firing time, and other conditions.

Figure 7:
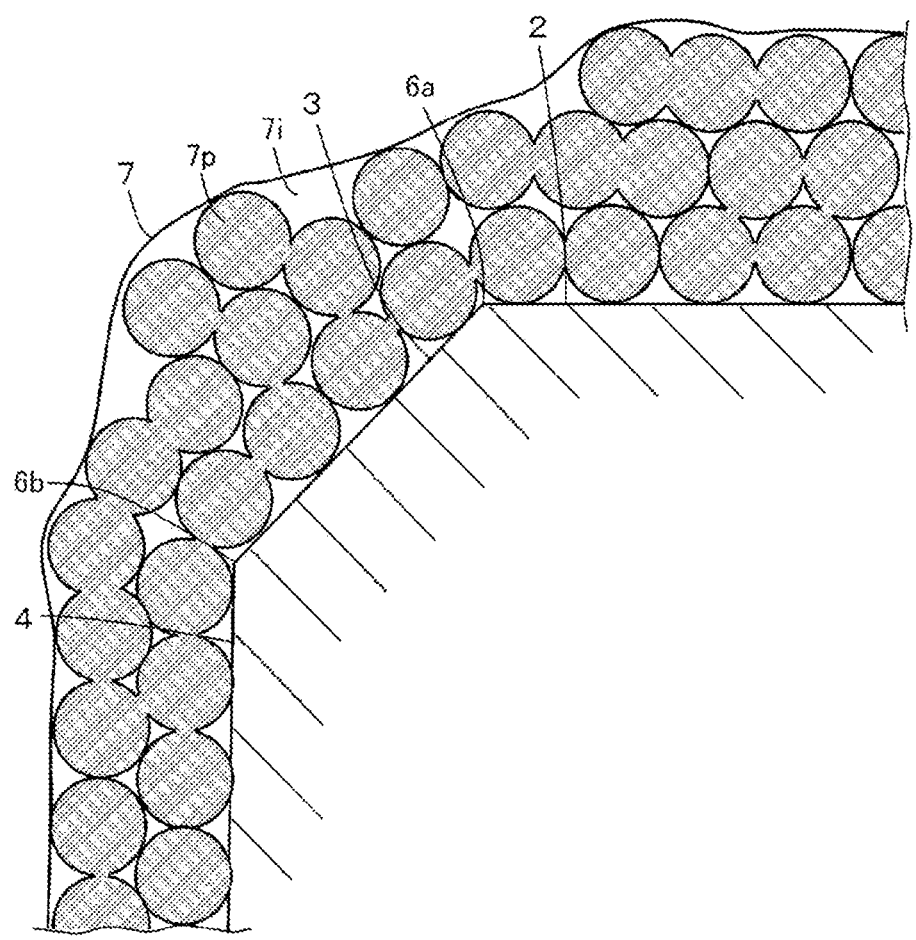
FIG. 7 is a partially enlarged cross-sectional view of a wiring board according to another embodiment of the present disclosure, schematically illustrating a corner of a substrate with wiring.

As illustrated in FIGS. 5 and 7, the side wiring 7 may have a thickness equal to the thickness of five conductive particles 7p or fewer in the first corner 6a and in the second corner 6b. This setting is based on the tendency of the conductive particles 7p not to easily contact and fuse with one another in the first corner 6a and in the second corner 6b and be difficult to be stacked on one another. However, with the conductive paste 7s having higher apparent viscosity and thus having less fluidity, about five conductive particles 7p may be stacked on one another in the first corner 6a and in the second corner 6b, despite the above tendency. In this structure, the side wiring 7 can have a lower resistance but remain thin. This allows the side wiring 7 to have high connectivity with the high-density wiring located on the main surface 2 of the substrate 5.

The side wiring 7 may have a thickness equal to the thickness of four conductive particles 7p or fewer in the first corner 6a and in the second corner 6b. More specifically, as shown in FIG. 10, the inclined surface 3 may have an inclination angle of 45°, the side wiring 7 may have a film thickness of 1.6 µm (thickness equal to the thickness of four conductive particles 7p with a minor diameter of 0.4 µm) in each corner, and the side wiring 7 may include a film thickness of about 10 µm in a flat portion, which may be a possible upper limit.

The side wiring 7 may have a thickness equal to the thickness of two conductive particles 7p or fewer in the first corner 6a and in the second corner 6b. For example, when the above diameter r is 0.8 µm, the side wiring 7 may have a thickness of about 1.6 µm in the first corner 6a and in the second corner 6b.

The side wiring 7 may have a thickness equal to the thickness of six conductive particles 7*p* or more in the first corner 6*a* and in the second corner 6*b*. In this structure, however, the side wiring 7 can have a greater thickness on the main surface 2 of the substrate 5, and can have lower connectivity with the high-density wiring located on the main surface 2. The amount of the conductive paste 7*s* to be applied may not be reduced easily.

The side wiring 7 may have a thickness of about 0.4 to 1.6 μm in the first corner 6*a* and in the second corner 6*b*. As illustrated in FIGS. 4 to 7, when the conductive particles 7*p* before firing each have a particle size of 3.0 μm, the side wiring 7 may have a thickness of about 1.5 to 6.0 μm in the first corner 6*a* and in the second corner 6*b*. The side wiring 7 may have a thickness of about 0.4 to 6.0 μm in the first corner 6*a* and in the second corner 6*b*.

Figure 6:
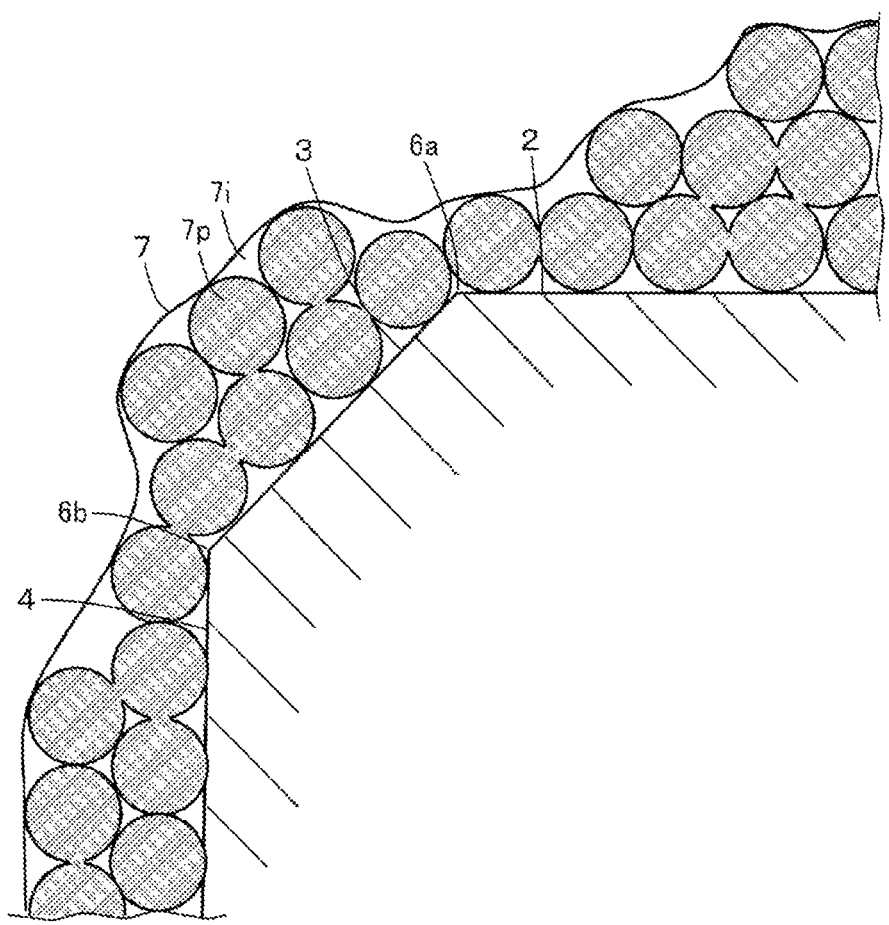
FIG. 6 is a partially enlarged cross-sectional view of a wiring board according to another embodiment of the present disclosure, schematically illustrating a corner of a substrate with wiring.

As illustrated in FIG. 6, the conductive particles 7*p* are spheres each with the diameter r, and the side wiring 7 may have a thickness at least equal to the diameter r of the conductive particle 7*p* in the first corner 6*a* and in the second corner 6*b*. The conductive particles 7*p* thus rarely deform through firing irrespective of the conditions including the conductive particles 7*p* having a high melting point, being dense, and undergoing firing at low temperatures and for a short time. For example, when the diameter r is 0.8 μm, the side wiring 7 may have a thickness of about 0.8 μm in the first corner 6*a* and in the second corner 6*b*.

The side wiring 7 may be a mixture of conductive particles 7*p* with major and minor diameters illustrated in FIGS. 4 and 5 and spherical conductive particles 7*p* illustrated in FIGS. 6 and 7.

The conductive particles 7*p* may include first conductive particles and second conductive particles. The size of the first conductive particles may be larger than the size of the second conductive particles. In this case, numerous first conductive particles are connected to one another with contact portions, fusion portions, or both portions to form a conductive path network. The second conductive particles can enter the gaps in the conductive path network to reinforce the conductive path network and improve the conductivity of the conductive path network. The size of the first conductive particles may be more than one time and not more than 10 times the size of the second conductive particles, but is not limited to this range. For example, the first conductive particles may have a size (diameter) of 0.4 to 1.6 μm, whereas the second conductive particles may have a size (diameter) not less than 0.04 to less than 1.6 μm. The size of spherical conductive particles may be specified using a diameter. The size of ellipsoidal conductive particles or conductive particles with other shapes having a major diameter and a minor diameter may be specified using a major diameter (maximum diameter).

The size of the first conductive particles may be larger than the size of the second conductive particles. The density of the first conductive particles may be higher than the density of the second conductive particles. When the conductive paste 7*s* is applied to, for example, the inclined surface 3, the first conductive particles with a higher density (heavier specific gravity) settle and deposit more quickly, and the second conductive particles with a lower density (lighter specific gravity) easily enter the gaps in the deposited layer containing the first conductive particles. The second conductive particles can enter the gaps in the conductive path network to reinforce the conductive path network and further improve the conductivity of the conductive path network. Various metals have different densities (g/cm3), or for example, 21.45 for platinum (Pt), 19.32 for gold (Au), 19.30 for tungsten (W), 10.50 for silver (Ag), 10.22 for molybdenum (Mo), 8.96 for copper (Cu), 8.90 for nickel (Ni), 8.57 for niobium (Nb), 7.87 for iron (Fe), 7.31 for tin (Sn), 7.31 for indium (In), 7.20 for chromium (Cr), 7.13 for zinc (Zn), 4.54 for titanium (Ti), 2.70 for aluminum (Al), and 1.74 for magnesium (Mg). Thus, for example, the first conductive particles may be made of silver, and the second conductive particles may be made of a silver-copper alloy.

The size of the first conductive particles may be larger than the size of the second conductive particles. The resistivity (Ωm) of the first conductive particles may be higher than the resistivity of the second conductive particles. In other words, the second conductive particles may have a conductivity (siemens per meter or S/m) higher than the conductivity of the first conductive particles. The second conductive particles can enter the gaps in the conductive path network to reinforce the conductive path network and further improve the conductivity of the conductive path network. For example, silver has a resistivity of 15.87 (nΩm), and copper has a resistivity of 16.78 (nΩm). Under the International Annealed Copper Standard (IACS) measurement (% IACS), which indicates the flow of electricity based on the flow of electricity in copper being 100%, the flow of electricity is 105.7% for silver (Ag), for gold (Au), 59.5% for aluminum (Al), 38.2% for magnesium (Mg), 31.8% for tungsten (W), 31.4% for molybdenum (Mo), 28.4% for zinc (Zn), 24.2% for nickel (Ni), for indium (In), 17.5% for iron (Fe), 16.0% for platinum (Pt), 14.6% for tin (Sn), 11.0% for niobium (Nb), and 4.0% for titanium (Ti). Thus, for example, the first conductive particles may be made of a silver-copper alloy, and the second conductive particles may be made of silver.

FIG. 10 is a graph showing the relationship between the film thicknesses of the wiring portions 7*a* and 7*b* of the side wiring 7 on the main surface 2 (the film thickness in the flat portion), and the film thickness of the wiring portion 7*c* of the side wiring 7 on the corner portion (first corner 6*a*) (the film thickness in the corner). In FIG. 10, the diamond sign indicates the relationship between the film thickness in the corner and the film thickness in the flat portion when the inclined surface 3 is a chamfered surface with a chamfer angle θ1 of with the main surface 2, the square sign indicates the relationship between the corner film thickness and the flat film thickness when the inclined surface 3 is a chamfered surface with the chamfer angle θ1 of 45° with the main surface 2. The triangle sign indicates the relationship between the film thickness in the corner and the film thickness in the flat portion when the inclined surface 3 is a chamfered surface with the chamfer angle θ1 of 60° with the main surface 2. The X sign indicates the relationship between the film thickness in the corner and the film thickness in the flat portion when the inclined surface 3 is a chamfered surface with the chamfer angle θ1 of 90° with the main surface 2. More specifically, the X sign indicates data for the structure including the inclined surface 3 aligned with the side surface 4 (no inclined surface 3). The solid line is a graph resulting from linear approximation of data (data with the square sign) obtained when the inclined surface 3 is a chamfered surface with the chamfer angle θ1 of 45°. The broken line is a graph resulting from linear approximation of data (data with the X sign) obtained when the inclined surface 3 is a chamfered surface with the chamfer angle θ1 of 90°.

The conductive particles contained in the conductive paste 7*s* have a mean particle size (φ) of 0.8 to 3.0 μm. When the corner film thickness is less than about ½ (0.4 μm) of the mean particle size, the conductive particles cannot remain on the corner. In this structure, the side wiring 7 is less likely to have stable conduction.

With no inclined surface 3 (chamfer angle θ1 of 90°), the film thickness for stable conduction is 11.8 μm in the flat portion (not less than 10 μm) and 0.9 μm in the corner. When the chamfer width c is 30 to 60°, the film thickness for stable conduction is 2 to 7 μm in the flat portion and 0.4 to 1.45 μm in the corner.

FIG. 11 is a graph showing the relationship between the chamfer width and the wire breakage rate of the side wiring 7. In FIG. 11, the vertical axis indicates the wire breakage rate, and the horizontal axis indicates the chamfer width. The diamond sign indicates a measurement value of the wire breakage rate when the conductive paste 7s is printed to form 480 lines of the side wiring 7 through dry friction performed 20 times on the inclined surface 3 when the inclined surface 3 is a chamfered surface with the chamfer angle θ1 of 45°. The graph reveals that the retention force (bonding force) of the conductive paste 7s on the inclined surface 3 of the substrate 5 is stable when the chamfer width c is not less than 10 μm.

The qualitative relationship between the bonding force of the conductive paste 7s for forming the side wiring 7 and the surface roughness of the substrate 5 will be described with reference to FIGS. 1 and 2. When the main surface 2, the inclined surface 3, and the side surface 4 of the substrate 5 have the same surface roughness, the conductive paste 7s can have the same bonding force on the main surface 2, the inclined surface 3, and the side surface 4. The bonding force of the conductive paste 7s mainly occurs under an intermolecular force between the liquid component of the conductive paste 7s and the fine irregularities on the surface of the substrate 5 when the liquid component fills such irregularities. The bonding force of the conductive paste 7s resists, as a reaction force, a force of gravity Fg that causes the conductive paste 7s to flow downward. The main surface 2, the inclined surface 3, and the side surface 4 have the same reaction force Fk. When the reaction force and the force causing the paste to flow downward are balanced (equalized), the applied conductive paste 7s remains substantially at the position at which the paste is applied and becomes stationary.

When an excess amount of the conductive paste 7s is applied, the force to cause the paste to flow downward may be greater than the reaction force, causing the conductive paste 7s to at least partially flow downward. Such cases are not discussed herein.

The conductive paste 7s receives a force F1 expressed using Formula 1 below on the main surface 2.

$$F1 = Fg \cdot \cos(90° - \theta1) \cdot \cos\theta1 - Fk \quad (1)$$

The conductive paste 7s receives a force F2 expressed using Formula 2 below on the inclined surface 3.

$$F2 = Fg \cdot \cos(90° - \theta1) - Fk \quad (2)$$

The conductive paste 7s receives a force F3 expressed using Formula 3 below on the side surface 4.

$$F3 = Fg - Fk \quad (3)$$

The forces F1, F2, and F3 received by the conductive paste 7s on the main surface 2, the inclined surface 3, and the side surface 4 have the relationship F3>F2>F1. The conductive paste 7s to be attached to and stationary on the main surface 2, the inclined surface 3, and the side surface 4 in a balanced state is to satisfy the relationship F1+F2+F3=0.

The forces F1, F2, and F3 have the relationship F3>F2>F1. Thus, the conductive paste 7s can have the bonding force on each of the main surface 2, the inclined surface 3, and the side surface 4 of the substrate 5 adjustable by varying the surface roughness (arithmetic mean roughness). More specifically, as illustrated in FIG. 8, the conductive paste 7s is applied to, for example, the roughened main surface 2. The uncured insulating component lip contained in the conductive paste 7s then fills the fine irregularities on the surface, increasing the bonding force with an intermolecular force. The conductive particles 7p contained in the conductive paste 7s are trapped in the fine irregularities on the surface to reduce the fluidity of the conductive paste 7s in the plane direction dp of the surface. This increases the bonding force of the conductive paste 7s on the surface. This satisfies, for example, the relationship Fk3>Fk2>Fk1, where Fk1 is the reaction force on the main surface 2, Fk2 is the reaction force on the inclined surface 3, and Fk3 is the reaction force on the side surface 4. With the resultant relationship F3≈F2≈F1, the conductive paste 7s is less likely to flow downward on the inclined surface 3 and around both sides of the inclined surface 3. Thus, the conductive paste 7s is less likely to be discontinuous on the inclined surface 3 and around both sides of the inclined surface 3 and is less likely to be too thin and have lower conductivity.

For the resistances Fk1, Fk2, and Fk3 to satisfy the relationship Fk3>Fk2>Fk1, the surface roughness Ra1 of the main surface 2, the surface roughness Ra2 of the inclined surface 3, and the surface roughness Ra3 of the side surface 4 of the substrate 5 may be, for example, Ra3>Ra2>Ra1, as illustrated in FIG. 9. The bonding force of the conductive paste 7s can be maximized by maximizing the contact area between the side surface 4 and the conductive paste 7s. The bonding force of the conductive paste 7s can be minimized by minimizing the contact area between the main surface 2 and the conductive paste 7s. The bonding force of the conductive paste 7s may be a moderate force by setting the contact area between the inclined surface 3 and the conductive paste 7s to an area with an intermediate size.

The width of the inclined surface 3 (chamfer width c) may be increased for the characteristics described below. The force of ΔF2·S2 is received across the inclined surface 3, where ΔF2 is the force on the conductive paste 7s per unit area on the inclined surface 3, and S2 is the area of the inclined surface 3. Similarly, the force of ΔF3·S3 is received across the side surface 4. For the inclined surface 3 with a larger area S2, the side surface 4 can have a smaller area S3. In this case, the difference (ΔF2·S2)−(ΔF3·S3) between the force ΔF2·S2 and the force ΔF3·S3 on the inclined surface 3 and the side surface 4 is smaller. The conductive paste 7s is thus less likely to flow downward along the inclined surface 3. The conductive paste 7s can have different overall fluidity or viscosity depending on the intermolecular force of the liquid resin component excluding conductive particles as its solid component. The conductive paste 7s may thus have the fluidity or viscosity adjustable to more easily control the film thickness.

In other embodiments, the wiring 7 may include a conductive paste 7s containing conductive particles of, for example, Ag, Cu, Al, or stainless steel, an uncured resin component, an alcohol solvent, and water. The conductive paste 7s may be applied to an intended portion from the first main surface 2a of the substrate 5 to the inclined surface 3, the side surface 4, and to the second main surface 2b through ink jetting rather than through printing, and cured by heating, photocuring using ultraviolet ray irradiation, or a combination of photocuring and heating.

In other embodiments of the present disclosure, the inclined surface 3 may be an outwardly and convexly curved round surface. For the inclined surface 3 being a round surface, the conductive paste 7s may have a larger contact area than for the inclined surface 3 being a chamfered surface, and thus has a greater bonding force to the inclined surface 3. The wiring 7 can thus have a greater film thickness on the inclined surface 3 to reduce wire breakage and increase conduction stability in high-density wiring or can have a greater film thickness on the inclined surface 3.

Various embodiments described above may be applicable to the inclined surface between the side surface 4 and the second main surface 2b, as illustrated in FIG. 2.

Although embodiments of the present disclosure have been described in detail, the present disclosure is not limited to the embodiments described above, and may be changed or varied in various manners without departing from the spirit and scope of the present disclosure. The components described in the above embodiments may be entirely or partially combined as appropriate unless any contradiction arises.

INDUSTRIAL APPLICABILITY

The wiring board according to one or more embodiments of the present disclosure may be used in light-emitting display devices such as LED displays and organic EL displays, and display devices such as liquid crystal displays. The display devices including the wiring board according to one or more embodiments of the present disclosure may be used in various electronic devices. Such electronic devices include composite and large display devices (multi-displays), automobile route guidance systems (car navigation systems), ship route guidance systems, aircraft route guidance systems, smartphones, mobile phones, tablets, personal digital assistants (PDAs), video cameras, digital still cameras, electronic organizers, electronic books, electronic dictionaries, personal computers, copiers, terminals for game devices, television sets, product display tags, price display tags, programmable display devices for industrial use, car audio systems, digital audio players, facsimile machines, printers, automatic teller machines (ATMs), vending machines, head-mounted displays (HMDs), digital display watches, and smartwatches.

REFERENCE SIGNS 1 wiring board
2 main surface
2a first main surface
2b second main surface
3 inclined surface
4 side surface
5 substrate
6 corner
7 wiring (side wiring)
7a wiring portion
7b wiring portion
7c wiring portion
7s conductive paste
c chamfer width
t film thickness
Ra1 first surface roughness
Ra2 second surface roughness
Ra3 third surface roughness
θ1 chamfer angle

The invention claimed is:
1. A wiring board, comprising:
a substrate including a main surface, a side surface, and an inclined surface, the inclined surface connecting the main surface and the side surface; and
wiring on the main surface, the inclined surface, and the side surface,
wherein the wiring has a content of conductive particles greater than a content of an insulating component, and the wiring has a thickness equal to a thickness of at least one of the conductive particles in a first corner between the main surface and the inclined surface and in a second corner between the inclined surface and the side surface.
2. The wiring board according to claim 1, wherein
the conductive particles have a major diameter and a minor diameter, and
the wiring has a thickness equal to at least the minor diameter of the conductive particles in the first corner and in the second corner.
3. The wiring board according to claim 1, wherein
the conductive particles include a first conductive particle and a second conductive particle, and a size of the first conductive particle is larger than a size of the second conductive particle.
4. The wiring board according to claim 3, wherein
a density of the first conductive particle is higher than a density of the second conductive particle.
5. The wiring board according to claim 3, wherein
a resistivity of the second conductive particle is lower than a resistivity of the first conductive particle.
6. The wiring board according to claim 1, wherein
the wiring has a thickness equal to a thickness of five or fewer conductive particles in the first corner and in the second corner.
7. The wiring board according to claim 1, wherein
the wiring has a content not less than 80 wt % of the conductive particles.
8. The wiring board according to claim 1, wherein
the inclined surface has a width of 10 to 200 μm inclusive.
9. The wiring board according to claim 1, wherein
the wiring has a thickness of 0.4 to 1.6 μm in the first corner and in the second corner.
10. The wiring board according to claim 1, wherein
the wiring has a thickness of 2 to 10 μm on the main surface and on the side surface.
11. The wiring board according to claim 1, wherein
the inclined surface has an inclination angle of 30 to 60° inclusive with respect to the main surface.
12. The wiring board according to claim 1, wherein
the inclined surface is a curved surface.
13. The wiring board according to claim 1, wherein
the main surface has a first surface roughness Ra1, the inclined surface has a second surface roughness Ra2, and the side surface has a third surface roughness Ra3, and
at least two of the first surface roughness Ra1, the second surface roughness Ra2, or the third surface roughness Ra3 differ from each other.
14. The wiring board according to claim 13, wherein
the second surface roughness Ra2 is greater than the first surface roughness Ra1.
15. The wiring board according to claim 13, wherein
the third surface roughness Ra3 is greater than the second surface roughness Ra2.
16. The wiring board according to claim 1, wherein
the substrate comprises glass.

17. A display device, comprising:
the wiring board according to claim 1; and
a plurality of light emitters in a matrix on a first main surface, of the main surface, of the substrate.

18. The display device according to claim 17, further comprising:
a drive on a second main surface, of the main surface, of the substrate, the drive being electrically connected to the plurality of light emitters with the wiring.

* * * * *